United States Patent
Chiang et al.

(10) Patent No.: US 11,506,725 B2
(45) Date of Patent: Nov. 22, 2022

(54) USB INTERFACE DETECTION MODULE

(71) Applicant: Primax Electronics Ltd., Taipei (TW)

(72) Inventors: Chun-Ying Chiang, Taipei (TW);
Tsung-Wen Hsueh, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 258 days.

(21) Appl. No.: 17/004,332

(22) Filed: Aug. 27, 2020

(65) Prior Publication Data

US 2022/0011382 A1 Jan. 13, 2022

(30) Foreign Application Priority Data

Jul. 10, 2020 (TW) ................................ 109123450

(51) Int. Cl.
| | | |
|---|---|---|
| *G06F 13/00* | (2006.01) | |
| *G06F 13/28* | (2006.01) | |
| *G06F 13/38* | (2006.01) | |
| *G06F 13/40* | (2006.01) | |
| *G06F 13/42* | (2006.01) | |
| *G01R 31/68* | (2020.01) | |
| *G01R 19/165* | (2006.01) | |
| *H01R 31/06* | (2006.01) | |
| *H03K 17/687* | (2006.01) | |

(52) U.S. Cl.
CPC ....... *G01R 31/68* (2020.01); *G01R 19/16576* (2013.01); *H01R 31/065* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 8,281,048 | B2* | 10/2012 | Fujii | G06F 13/4081 |
| | | | | 710/16 |
| 8,850,097 | B2* | 9/2014 | Chin | H03K 19/01806 |
| | | | | 710/16 |
| 8,928,189 | B2* | 1/2015 | Toivola | G06F 13/4081 |
| | | | | 307/130 |
| 9,207,697 | B2* | 12/2015 | Tung | G06F 13/385 |
| 2002/0159276 | A1* | 10/2002 | Deboy | H02M 3/33507 |
| | | | | 363/20 |
| 2020/0044650 | A1* | 2/2020 | Fujita | H01H 9/542 |

\* cited by examiner

*Primary Examiner* — Kenneth B Wells
(74) *Attorney, Agent, or Firm* — Kirton McConkie; Evan R. Witt

(57) ABSTRACT

A USB interface detection module includes a detection unit and an adapting device. The adapting device is electrically connected between a first electronic device and a second electronic device. According to the interface specification of the first electronic device, the voltage value of a configuration channel pin is changeable through the use of the GND_DRAIN pin and the switching action of a field-effect transistor switch. Consequently, the interface specification of the first electronic device is acquired by the second electronic device.

15 Claims, 3 Drawing Sheets

USB INTERFACE DETECTION MODULE

FIELD OF THE INVENTION

The present invention relates to a USB technology, and more particularly to a USB interface detection module.

BACKGROUND OF THE INVENTION

With increasing development of information technologies, portable electronic devices are becoming more and more popular. Since current computer systems have powerful multimedia processing functions, various portable electronic devices can be directly in communication with the computer system to perform various data transmitting tasks. As known, a universal serial bus (USB) interface is one of the most popular connecting interfaces between the portable electronic device and the computer system. This is because a USB interface has many benefits such as plug and play capability, hot plug capability, high transmission speed, and the like.

More particularly, a universal serial bus also has the function of transferring a current. Consequently, the computer system may provide electrical energy to the portable electronic device through the USB interface. By acquiring the electrical energy, the portable electronic device can be normally operated. Alternatively, the computer system may provide the electrical energy to charge a lithium battery of the portable electronic device. Generally, in case that the USB interface is a USB2.0 interface, the computer system is able to provide a current of about 500 mA to the portable electronic device. On the other hand, if the USB interface is a USB3.0 interface, the computer system is able to provide a current of about 900 mA to the portable electronic device. Consequently, if the computer system has a USB3.0 interface, the lithium battery of the portable electronic device may be charged at a high charging speed.

Moreover, when the portable electronic device is in communication with the computer system through a USB cable, the portable electronic device may firstly judge the interface specification of the computer system and then request the computer system to provide a corresponding current. In accordance with a conventional method of judging the interface specification of the computer system, an inquiring signal is firstly transmitted from the portable electronic device to the computer system through a universal serial bus. In response to the inquiring signal, a feedback signal is outputted from the computer system to the portable electronic device. According to the feedback signal, the portable electronic device can judge the interface specification of the computer system. If the portable electronic device judges that the interface specification of the computer system is the USB3.0 interface, the portable electronic device will request the computer system to provide the current of about 900 mA. Whereas, if the portable electronic device judges that the interface specification of the computer system is the USB2.0 interface, the portable electronic device will request the computer system to provide the current of about 500 mA.

From the above discussions, after the inquiring signal is transmitted from the portable electronic device to the computer system and then the feedback signal is outputted from the computer system to the portable electronic device, the portable electronic device can judge the interface specification of the computer system according to the feedback signal. In other words, the conventional method of judging the interface specification of the computer system is time-consuming. Moreover, for implementing the conventional judging method, the portable electronic device should comprise complicated integrated circuits and wires. Under this circumstance, the fabricating cost of the portable electronic device is increased.

SUMMARY OF THE INVENTION

The present invention provides a USB interface detection module with an adapting device in order to quickly judge a specification of a USB interface. Because the USB interface detection module is not equipped with complicated integrated circuits and wires, the fabricating cost is low.

In accordance with an aspect of the present invention, a USB interface detection module is provided. The USB interface detection module includes an adapting device and a detection unit. The adapting device includes a first adapting part, a second adapting part and a circuit unit. The first adapting part includes a GND_DRAIN pin. The second adapting part includes a configuration channel pin. The circuit unit includes a field-effect transistor switch. The field-effect transistor switch is electrically connected between the GND_DRAIN pin and the configuration channel pin. The detection unit is electrically connectable with the configuration channel pin. When two terminals of a first USB cable are respectively plugged into a first connector part of a first electronic device and the first adapting part and two terminals of a second USB cable are respectively plugged into the second adapting part and a second connector part of a second electronic device, the detection unit detects a voltage value of the configuration channel pin and judges an interface specification of the first connector part according to the voltage value.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
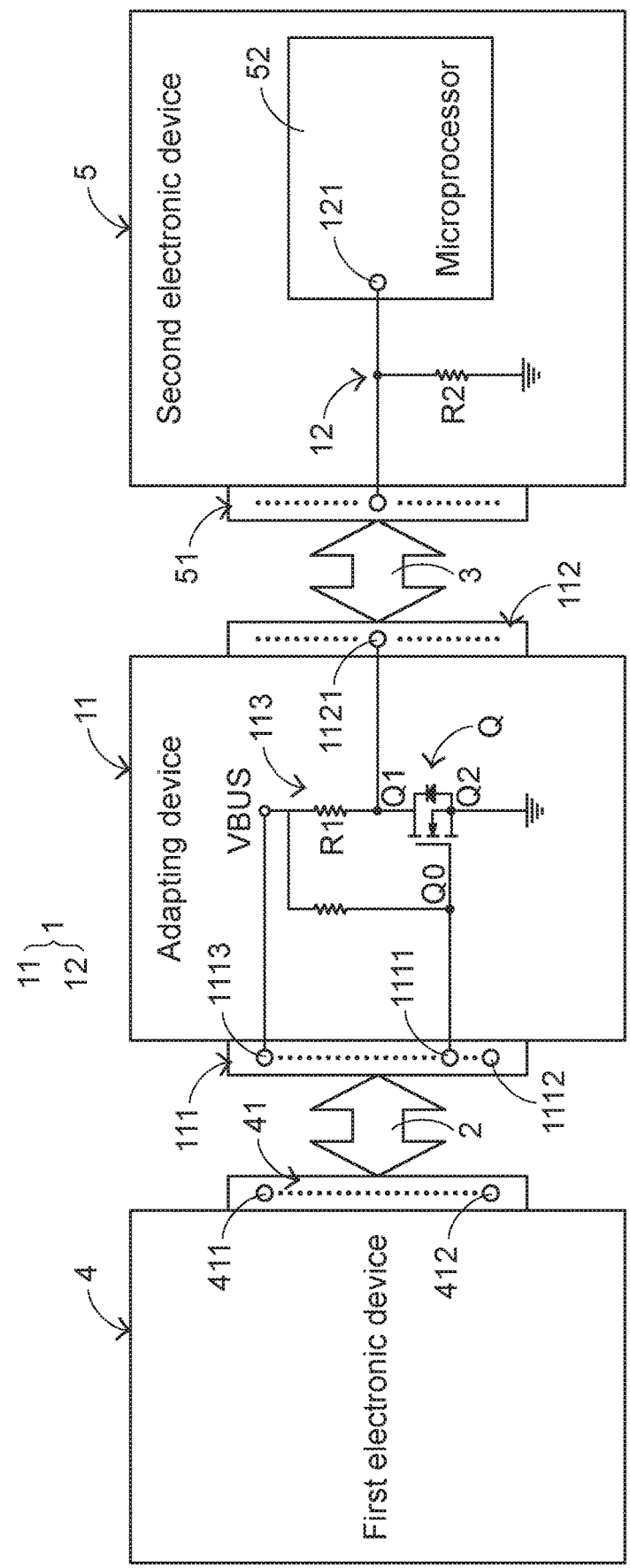
FIG. 1 is a schematic view illustrating a USB interface detection module according to an embodiment of the present invention.

The embodiments of present invention will be described more specifically with reference to the following drawings. Generally, in the drawings and specifications, identical or similar components are designated by identical numeral references. For well understanding the present invention, the elements shown in the drawings are not in scale with the elements of the practical product. In the following embodiments and drawings, the elements irrelevant to the concepts of the present invention or the elements well known to those skilled in the art are omitted. It is noted that numerous modifications and alterations may be made while retaining the teachings of the invention.

Figure 2:
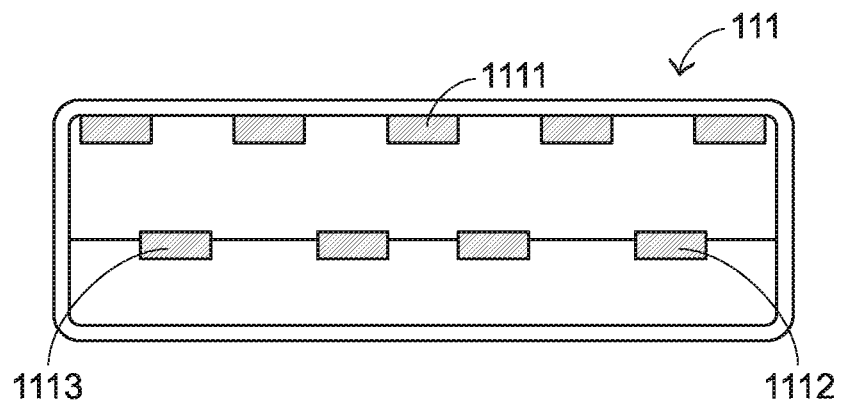
FIG. 2 is a schematic view illustrating a first adapting part of an adapting device of the USB interface detection module as shown in FIG. 1.
Figure 3:
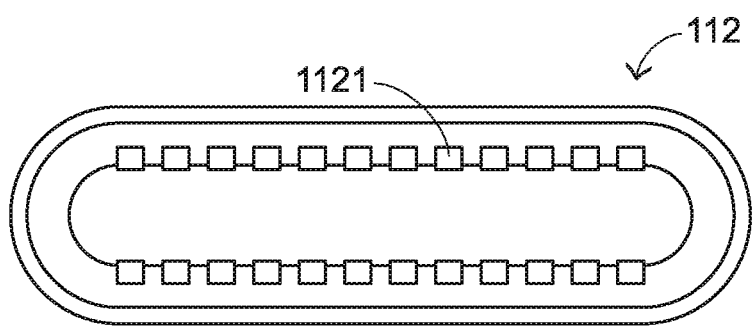
FIG. 3 is a schematic view illustrating a second adapting part of the adapting device of the USB interface detection module as shown in FIG. 1.

Please refer to FIGS. 1, 2 and 3. FIG. 1 is a schematic view illustrating a USB interface detection module according to an embodiment of the present invention. FIG. 2 is a schematic view illustrating a first adapting part of an adapting device of the USB interface detection module as shown in FIG. 1. FIG. 3 is a schematic view illustrating a second adapting part of the adapting device of the USB interface detection module as shown in FIG. 1.

The USB interface detection module 1 comprises an adapting device 11 and a detection unit 12. The adapting device 11 comprises a first adapting part 111, a second adapting part 112 and a circuit unit 113. The circuit unit 113 is electrically connected with the first adapting part 111 and the second adapting part 112. The circuit unit 113 at least comprises a field-effect transistor (MOS) switch Q and a first resistor R1. The field-effect transistor switch Q of the circuit unit 113 includes a gate electrode Q0, a first electrode Q1 and a second electrode Q2. The first adapting part 111 of the adapting device 11 has plural pins. These pins at least include a GND_DRAIN pin 1111, a GND pin 1112 and a VBUS pin 1113. The second adapting part 112 also comprises plural pins. These pins at least include a configuration channel (CC) pin 1121.

The gate electrode Q0 of the field-effect transistor switch Q is electrically connected with the GND_DRAIN pin 1111 of the first adapting part 111. The first electrode Q1 of the field-effect transistor switch Q is electrically connected between the VBUS pin 1113 of the first adapting part 111 and the CC pin 1121 of the second adapting part 112. The second electrode Q2 of the field-effect transistor switch Q is electrically connected to a ground terminal. For example, the second electrode Q2 of the field-effect transistor switch Q is electrically connected to the ground terminal through the GND pin 1112 of the first adapting part 111. The two terminals of the first resistor R1 of the circuit unit 113 are electrically connected with the first electrode Q1 of the field-effect transistor switch Q and the VBUS pin 1113 of the first adapting part 111, respectively. In this embodiment, the first electrode Q1 and the second electrode Q2 of the field-effect transistor switch Q are a drain electrode and a source electrode, respectively. That is, the field-effect transistor switch Q is an NMOS field-effect transistor switch. It is noted that the example of the field-effect transistor switch Q is not restricted. For example, in another embodiment, the field-effect transistor switch Q is a PMOS field-effect transistor switch.

In an embodiment, a first USB cable 2 is pluggable into the first adapting part 111 of the adapting device 11. The interface of the adapting part 111 complies with the USB3.0 specification. A second USB cable 3 is pluggable into the second adapting part 112 of the adapting device 11. The interface of the second adapting part 112 complies with the specification of a C-type (Type-C) USB interface. When the two terminals of the first USB cable 2 are respectively plugged into the first adapting part 111 of the adapting device 11 and a first connector part 41 of a first electronic device 4, the adapting device 11 and the first electronic device 4 are electrically connected with each other. When the two terminals of the second USB cable 3 are respectively plugged into the second adapting part 112 of the adapting device 11 and a second connector part 51 of a second electronic device 5, the adapting device 11 and the second electronic device 5 are electrically connected with each other.

For example, the first electronic device 4 is a computer system, and the second electronic device 5 is a keyboard device, a mouse device or any other appropriate portable electronic device with a chargeable battery. Preferably but not exclusively, the interface of the second connector part 51 complies with the specification of the C-type (Type-C) USB interface.

In an embodiment, the detection unit 12 is installed in the second electronic device 5. When the two terminals of the second USB cable 3 are respectively plugged into the second adapting part 112 of the adapting device 11 and the second connector part 51 of the second electronic device 5, the detection unit 12 is electrically connected with the CC pin 1121 of the second adapting part 112. When the two terminals of the first USB cable 2 are respectively plugged into the first adapting part 111 of the adapting device 11 and the first connector part 41 of the first electronic device 4 and the two terminals of the second USB cable 3 are respectively plugged into the second adapting part 112 of the adapting device 11 and the second connector part 51 of the second electronic device 5, the detection unit 12 detects the voltage value of the CC pin 1121 and judges the interface specification of the first connector part 41 of the first electronic device 4 according to the voltage value.

In an embodiment, the detection unit 12 comprises a second resistor R2. A first terminal of the second resistor R2 is connected to the ground terminal. When the second electronic device 5 is electrically connected with the adapting device 11 through the second USB cable 3, a second terminal of the second resistor R2 is electrically connected with the CC pin 1121 of the second adapting part 112. Preferably but not exclusively, a detection terminal 121 of the detection unit 12 is installed in a microprocessor 52 of the second electronic device 5.

A method of using the USB interface detection module 1 to detect the interface specification of the first connector part 41 of the first electronic device 4 will be described as follows.

Figure 4:
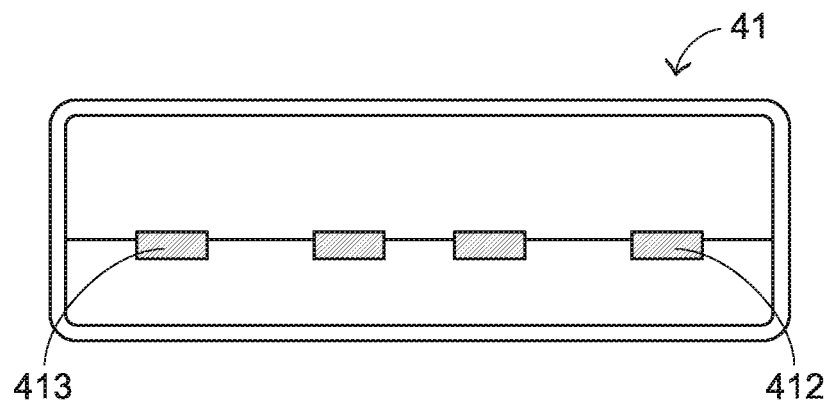
FIG. 4 schematically illustrates a first usage scenario of using the first connector part of the first electronic device.

Please refer to FIGS. 1, 2, 3 and 4. FIG. 4 schematically illustrates a first usage scenario of using the first connector part of the first electronic device. In this usage scenario, the interface of the first connector part 41 of the first electronic device 4 complies with the USB2.0 specification. The first connector part 41 of the first electronic device 4 includes a VBUS pin 411 and a GND pin 412. However, the first connector part 41 of the first electronic device 4 is not equipped with the GND_DRAIN pin. When the two terminals of the first USB cable 2 are respectively plugged into the first adapting part 111 of the adapting device 11 and the first connector part 41 of the first electronic device 4, the VBUS pin 1113 and the GND pin 1112 of the first adapting part 111 are electrically connected with the VBUS pin 411 and the GND pin 412 of the first connector part 41, respectively. The GND_DRAIN pin 1111 of the first adapting part 111 is in a floating state. Consequently, the first electrode Q1 and the second electrode Q2 of the field-effect transistor switch Q of the circuit unit 113 are turned on. Meanwhile, the voltage value of the CC pin 1121 of the second adapting part 112 is 0V. Consequently, if the voltage value detected by the detection terminal 121 of the detection unit 12 in the second electronic device 5 is 0V, the second electronic device 5 judges that the interface of the first connector part 41 of the first electronic device 4 complies with the USB2.0 specification.

Figure 5:
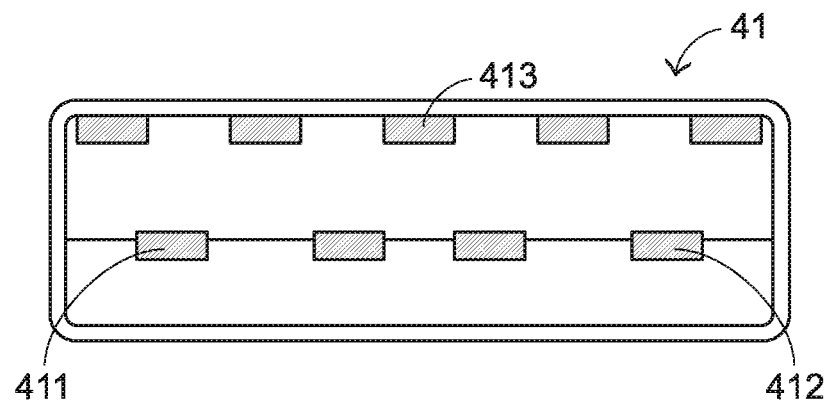
FIG. 5 schematically illustrates a second usage scenario of using the first connector part of the first electronic device.

Please refer to FIGS. 1, 2, 3 and 5. FIG. 5 schematically illustrates a second usage scenario of using the first connector part of the first electronic device. In this usage scenario, the interface of the first connector part 41 of the first electronic device 4 complies with the USB3.0 specification. The first connector part 41 of the first electronic device 4 includes a GND_DRAIN pin 413, a GND pin 412 and a VBUS pin 411. When the two terminals of the first USB cable 2 are respectively plugged into the first adapting part 111 of the adapting device 11 and the first connector part 41 of the first electronic device 4, the GND_DRAIN pin 1111, the GND pin 1112 and the VBUS pin 1113 of the first adapting part 111 are electrically connected with the GND_DRAIN pin 413, the GND pin 412 and the VBUS pin 411 of the first connector part 41, respectively. Consequently, the first electrode Q1 and the second electrode Q2 of the field-effect transistor switch Q of the circuit unit 113 are turned off. Meanwhile, the voltage value of the CC pin 1121 of the second adapting part 112 is higher than 0V. Consequently, if the voltage value detected by the detection terminal 121 of the detection unit 12 in the second electronic device 5 is higher than 0V, the second electronic device 5 judges that the interface of the first connector part 41 of the first electronic device 4 complies with the USB3.0 specification.

Moreover, in case that the interface of the first connector part 41 of the first electronic device 4 complies with the USB3.0 specification, the voltage value detected by the detection terminal 121 of the detection unit 12 in the second electronic device 5 is determined according to the resistance of the first resistor R1 of the circuit unit 113 and the resistor R2 of the detection unit 12. That is, the voltage value detected by the detection terminal 121 of the detection unit 12 in the second electronic device 5 is equal to the voltage value of the VBUS pin 411 of the first connector part 41 (i.e., the voltage value of the VBUS pin 1113 of the first adapting part 111)×the resistance of the second resistor R2/(the resistance of the first resistor R1+the resistance of the second resistor R2). Preferably but not exclusively, the resistance of the first resistor R1 and/or the resistance of the second resistor R2 are adjusted by the USB interface detection module 1. Consequently, the voltage value detected by the detection terminal 121 of the detection unit 12 in the second electronic device 5 is lower than an operating voltage of the second electronic device 5.

From the above descriptions, the present invention provides the USB interface detection module 1. According to the interface specification of the first connector part 41 of the first electronic device 4, the voltage value of the CC pin 1121 is changeable through the use of the GND_DRAIN pin 1111 and the action of switching the on/off states of the field-effect transistor switch Q. Consequently, the interface specification of the first connector part 41 of the first electronic device 4 is acquired by the second electronic device 5. In comparison with the conventional judging method, the technology of the present invention can judge the interface specification at a faster speed. Moreover, since it is not necessary to install complicated integrated circuits and wires in the second electronic device 5, the fabricating cost of the USB interface detection module of the present invention is reduced.

While the invention has been described in terms of what is presently considered to be the most practical and preferred embodiments, it is to be understood that the invention is not limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A USB interface detection module, comprising:
   an adapting device comprising a first adapting part, a second adapting part and a circuit unit, wherein the first adapting part comprises a GND_DRAIN pin, the second adapting part comprises a configuration channel pin, the circuit unit comprises a field-effect transistor switch, and the field-effect transistor switch is electrically connected between the GND_DRAIN pin and the configuration channel pin; and
   a detection unit electrically connectable with the configuration channel pin, wherein when two terminals of a first USB cable are respectively plugged into a first connector part of a first electronic device and the first adapting part and two terminals of a second USB cable are respectively plugged into the second adapting part and a second connector part of a second electronic device, the detection unit detects a voltage value of the configuration channel pin and judges an interface specification of the first connector part according to the voltage value.

2. The USB interface detection module according to claim 1, wherein a gate electrode of the field-effect transistor switch is electrically connected with the GND_DRAIN pin.

3. The USB interface detection module according to claim 2, wherein when the two terminals of the first USB cable are respectively plugged into the first connector part and the first adapting part and the interface specification of the first connector part complies with a USB2.0 specification, the field-effect transistor switch is turned on.

4. The USB interface detection module according to claim 2, wherein when the two terminals of the first USB cable are respectively plugged into the first connector part and the first adapting part and the interface specification of the first connector part complies with a USB3.0 specification, the field-effect transistor switch is not turned on.

5. The USB interface detection module according to claim 2, wherein the first adapting part further comprises a VBUS pin, a first electrode of the field-effect transistor switch is electrically connected between the VBUS pin and the configuration channel pin, and a second electrode of the field-effect transistor switch is electrically connected to a ground terminal.

6. The USB interface detection module according to claim 5, wherein one of the first electrode and the second electrode of the field-effect transistor switch is a drain electrode, and the other of the first electrode and the second electrode of the field-effect transistor switch is a source electrode.

7. The USB interface detection module according to claim 5, wherein the circuit unit further comprises a first resistor, and the first resistor is electrically connected between the first electrode of the field-effect transistor switch and the VBUS pin.

8. The USB interface detection module according to claim 7, wherein the detection unit comprises a second resistor, wherein a first terminal of the second resistor is electrically connected with the configuration channel pin, and a second terminal of the second resistor is connected to the ground terminal.

9. The USB interface detection module according to claim 8, wherein the voltage value detected by the detection unit is lower than an operating voltage of the second electronic device, the voltage value being determined by the first resistor and the second resistor.

10. The USB interface detection module according to claim 1, wherein the detection unit is installed in the second electronic device.

11. The USB interface detection module according to claim 1, wherein the second electronic device is a keyboard device or a mouse device.

12. The USB interface detection module according to claim 1, wherein an interface of the first adapting part complies with a USB3.0 specification.

13. The USB interface detection module according to claim 1, wherein an interface of the second adapting part complies with a C-type USB specification.

14. The USB interface detection module according to claim 1, wherein if the voltage value of the configuration channel pin detected by the detection unit is 0V, the detection unit judges that the interface specification of the first connector part complies with a USB2.0 specification.

15. The USB interface detection module according to claim 1, wherein if the voltage value of the configuration channel pin detected by the detection unit is higher than 0V, the detection unit judges that the interface specification of the first connector part complies with a USB3.0 specification.

\* \* \* \* \*